(12) United States Patent
Saitoh et al.

(10) Patent No.: US 11,333,813 B2
(45) Date of Patent: May 17, 2022

(54) OPTICAL FILM AND METHOD FOR PRODUCING OPTICAL FILM

(71) Applicant: FUJIFILM Corporation, Tokyo (JP)

(72) Inventors: Yukito Saitoh, Minamiashigara (JP); Kunihiro Atsumi, Minamiashigara (JP); Teruki Niori, Minamiashigara (JP); Shinichi Morishima, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/597,144

(22) Filed: Oct. 9, 2019

(65) Prior Publication Data

US 2020/0041708 A1 Feb. 6, 2020

Related U.S. Application Data

(63) Continuation of application No. PCT/JP2018/014257, filed on Apr. 3, 2018.

(30) Foreign Application Priority Data

Apr. 10, 2017 (JP) .............................. JP2017-077665

(51) Int. Cl.
*G02F 1/13363* (2006.01)
*H01L 51/52* (2006.01)
(Continued)

(52) U.S. Cl.
CPC ..... *G02B 5/3016* (2013.01); *G02F 1/133634* (2013.01); *H01L 51/5281* (2013.01);
(Continued)

(58) Field of Classification Search
CPC ......... G02F 1/133634; G02F 1/133636; G02F 2001/133633; G02F 2001/133637;
(Continued)

(56) References Cited

U.S. PATENT DOCUMENTS 6,565,974 B1 * 5/2003 Uchiyama ................ G02B 1/10
428/412
2002/0039159 A1 4/2002 Yano et al.
(Continued)

FOREIGN PATENT DOCUMENTS

JP 2002-107541 A 4/2002
JP 2003-313556 A 11/2003
(Continued)

OTHER PUBLICATIONS

Yang, Deng-Ke et. al., Fundamentals of Liquid Crystal Devices, Second Edition, Chapter 10, p. 342; Published by John Wiley & Sons, Ltd. 2015. (Year: 2015).*
(Continued)

*Primary Examiner* — Angela K Davison
(74) *Attorney, Agent, or Firm* — Birch, Stewart, Kolasch & Birch, LLP

(57) ABSTRACT

An optical film is an optical film in which a cholesteric liquid crystalline phase is fixed and a helical axis of the cholesteric liquid crystalline phase is aligned in an in-plane uniaxial direction, and an Nz is 0.2 to 0.75.

10 Claims, 3 Drawing Sheets

(51) Int. Cl.
*G02B 5/30* (2006.01)
*G02F 1/1343* (2006.01)

(52) U.S. Cl.
CPC .. *G02F 1/133633* (2021.01); *G02F 1/133637* (2021.01); *G02F 1/133638* (2021.01); *G02F 1/134363* (2013.01)

(58) Field of Classification Search
CPC ........ G02F 2001/133638; G02F 2001/133543; G02F 2413/15; H01L 51/5281; H01J 2329/892; G02B 1/11
See application file for complete search history.

(56) References Cited

U.S. PATENT DOCUMENTS

| | | | | |
|---|---|---|---|---|
| 2002/0063819 | A1* | 5/2002 | Yano | G02F 1/133634 |
| | | | | 349/96 |
| 2005/0206818 | A1* | 9/2005 | Hayashi | C09K 19/588 |
| | | | | 349/123 |
| 2009/0033839 | A1* | 2/2009 | Fukuda | G02F 1/133632 |
| | | | | 349/102 |
| 2010/0053510 | A1 | 3/2010 | Bitou et al. | |
| 2015/0277007 | A1 | 10/2015 | Matsuyama et al. | |

FOREIGN PATENT DOCUMENTS

| | | |
|---|---|---|
| JP | 2005-215631 A | 8/2005 |
| JP | 2006-323312 A | 11/2006 |
| JP | 2008-165185 A | 7/2008 |
| JP | 2008-256998 A | 10/2008 |
| JP | 2015-200877 A | 11/2015 |
| WO | WO 00/26705 A1 | 5/2000 |

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2018/014257, dated Oct. 24, 2019, with English translation.
International Search Report (Form PCT/ISA/210) for International Application No. PCT/JP2018/014257, dated Jun. 19, 2018, with English translation.
Japanese Office Action, dated Nov. 24, 2020, for corresponding Japanese Application No. 2019-512456, with an English translation.

* cited by examiner $N_z = 0$

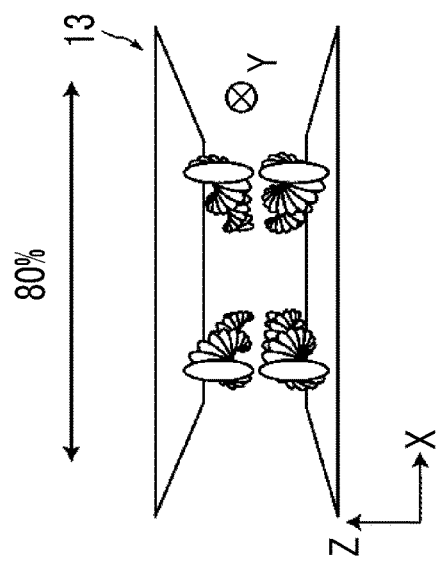 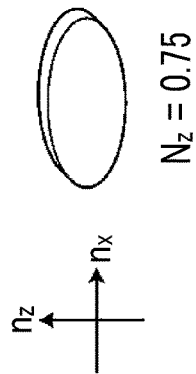
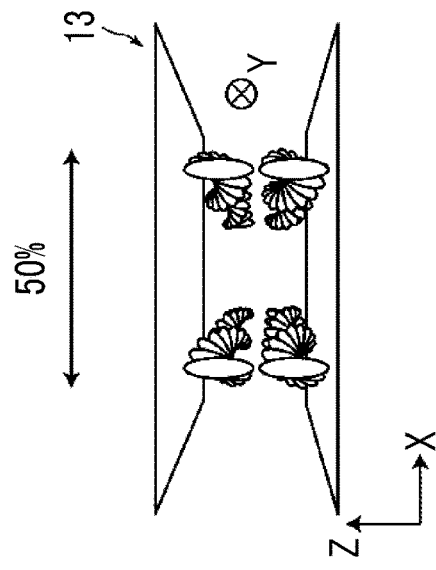 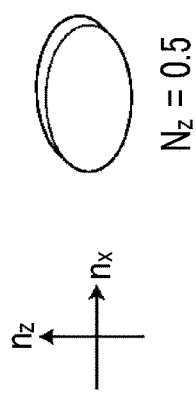
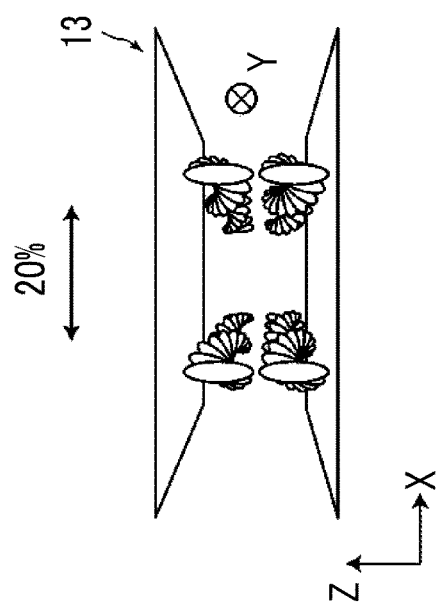 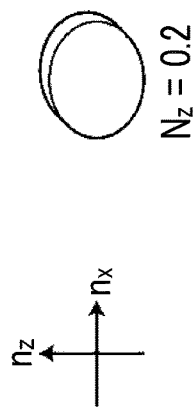
FIG. 3A   FIG. 3B   FIG. 3C

OPTICAL FILM AND METHOD FOR PRODUCING OPTICAL FILM

CROSS-REFERENCE TO RELATED APPLICATIONS

This application is a Continuation of PCT International Application No. PCT/JP2018/014257, filed on Apr. 3, 2018, which claims priority under 35 U.S.C. § 119(a) to Japanese Patent Application No. 2017-077665, filed on Apr. 10, 2017. Each of the above application(s) is hereby expressly incorporated by reference, in its entirety, into the present application.

BACKGROUND OF THE INVENTION

1. Field of the Invention

The present invention relates to an optical film and particularly relates to an optical film used in a display device. Also, the present invention relates to a method for producing the optical film.

2. Description of the Related Art

In recent years, with the progress of high brightness and high contrast in televisions and monitors, a high dynamic range (HDR), which makes it possible to express the gradation of bright parts that could not reproduce until now in a state close to the naked eye, has been attracting attention. In order to achieve such HDR, the use of organic light emitting diodes (OLEDs) is in progress. Organic EL display devices using OLEDs can be made thinner and lighter than devices using liquid crystals, have features such as low power consumption, high speed response, and high contrast, and are expected to be applied to lighting, televisions, and display devices. Particularly, by using a flexible substrate, there is a possibility that a display device having a shape which could not be realized so far can be realized, and the display performance is high in visibility and low in viewing angle dependency.

On the other hand, among liquid crystal display devices, a liquid crystal display device adopting as an in-plane-switching (IPS) mode as a driving mode controls the light amount of backlight by rotating liquid crystal molecules horizontally laid in a lateral direction, and thus has a feature that the inclination of the liquid crystal molecules in the vertical direction does not occur and changes in brightness and color due to the viewing angle are reduced.

Further, in order to improve the viewing angles of these organic EL display devices and liquid crystal display devices, a method using an optical compensation film such as a phase difference film has been known. As a phase difference film, depending on the properties to be compensated, a λ/4 plate or a λ/2 plate is used. For example, a broadband λ/4 plate has been used as an antireflection film for an organic EL display device, and it has been reported that changes in brightness and color are reduced. In addition, in a case of using a λ/2 plate, an ideal compensation film for an IPS mode liquid crystal display device is formed and the like, and thus the λ/2 plate is very useful.

In a case where such a phase difference film of a λ/4 plate or a λ/2 plate is used, it is easy to convert monochromatic light into light with appropriate phase difference, but in a case of white light having a plurality of monochromatic light beams mixed therein, it is difficult to convert all the light beams to ones having a wavelength with the same phase difference. The reason therefor is that materials constituting the phase difference film have a different phase difference depending on the wavelength, and generally, a component having a shorter wavelength is more susceptible to phase difference.

Since white light obtained by light transmission through a phase difference film has wavelength dispersibility (or forward wavelength dispersibility) having different phase difference depending on the wavelength, there is a problem that polarized light converted by the phase difference film due to a change in the polarization state at each wavelength would be colored. In order to solve such problems, materials having so-called reverse wavelength dispersibility have been investigated to prepare a phase difference film having no change in phase difference in a wide wavelength range. JP2015-200877A proposes an optical film exhibiting excellent reverse wavelength dispersibility and a liquid crystal compound to be used in the optical film.

On the other hand, JP2003-313556A discloses a method for producing an optical film by mixing a polymer compound and a liquid crystal compound or a liquid crystal composition, heating the mixture at a temperature at which both materials are compatible, and then cooling the resultant to room temperature, and discloses that the liquid crystal compound is aligned in the liquid crystalline phase by mechanically stretching the mixture. By stretching the optical film, the liquid crystal compound in the composite material is aligned to improve the light transmittance.

SUMMARY OF THE INVENTION

As one of the indexes representing the properties of the optical film, there is an Nz factor representing the magnitude relationship among the refractive index components $n_x$, $n_y$, and $n_z$ of the optical film. In a film having an Nz factor of 0.5, the phase difference value is substantially constant regardless of the viewing angle. It is known that the viewing angle properties are significantly improved by using such a film for a liquid crystal display device. However, an optical film having an Nz factor of 0.5 is difficult to realize.

The present invention is made in consideration of such circumstances and an object thereof is to provide an optical film having low viewing angle dependency and a method for producing an optical film by realizing an optical film having an ideal optical property of having an Nz factor of 0.5 or very close to 0.5.

According to the present invention, there is provided an optical film in which a cholesteric liquid crystalline phase is fixed, in which a helical axis of the cholesteric liquid crystalline phase is aligned in an in-plane uniaxial direction, and when a refractive index in a Z-axis direction is nz with a thickness direction of the optical film as a Z-axis, a refractive index in an X-axis direction is nx with one in-plane direction in which the refractive index is maximum and which is perpendicular to the Z-axis as an X-axis, a refractive index in a Y-axis direction is ny with an in-plane direction perpendicular to the X-axis as a Y-axis, and the uniaxial direction is the Y-axis direction, an Nz defined by Equation (1) is 0.2 to 0.75.

$$Nz=(nx-nz)/(nx-ny) \qquad (1)$$

It is desirable that the optical film is a stretched film stretched in a direction orthogonal to the uniaxial direction in the plane.

It is desirable that as a liquid crystal compound constituting the cholesteric liquid crystalline phase, a reverse wavelength dispersion liquid crystal compound is included.

The optical film may be a λ/4 plate.

The optical film may be a λ/2 plate.

A method for producing an optical film comprises a step of stretching an optical film, in which a helical axis of a cholesteric liquid crystalline phase is aligned and fixed in an in-plane uniaxial direction, in a direction orthogonal to the uniaxial direction in the plane.

It is desirable that the step of the stretching is performed such that a stretching ratio in a stretching direction is 20% or more and 80% or less.

In the optical film of the present invention, the helical axis of the cholesteric liquid crystal is aligned in the in-plane uniaxial direction, and the Nz factor is 0.2 to 0.75. In such an optical film, since the phase difference value is substantially constant regardless of the viewing angle, the viewing angle properties can be significantly improved by using the film for a liquid crystal display device.

BRIEF DESCRIPTION OF THE DRAWINGS

FIGS. 3A, 3B, and 3C are views for explaining the stretching of the optical film according to the embodiment of the present invention and a change in optical properties.

DESCRIPTION OF THE PREFERRED EMBODIMENTS

Figure 1:
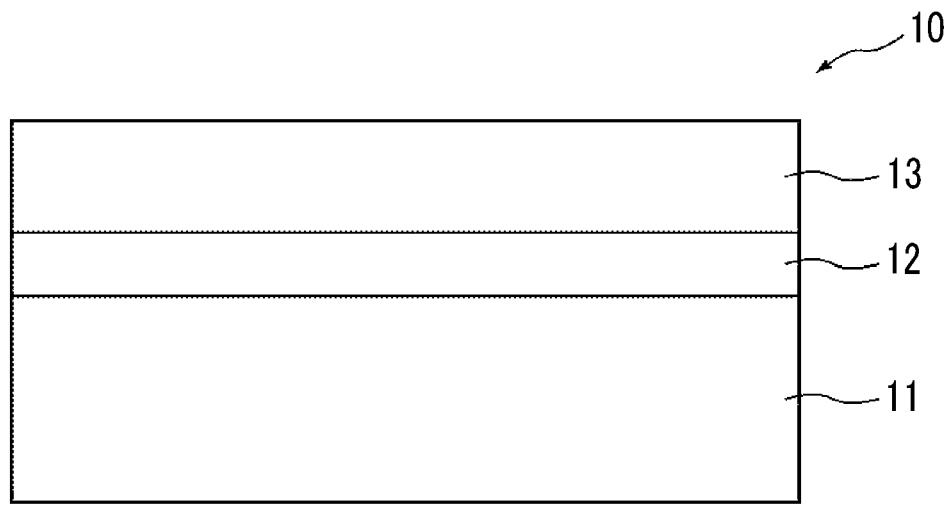
FIG. 1 is a schematic cross-sectional view showing an embodiment of an optical film of the present invention.

Hereinafter, the present invention will be described in detail.

The following description of the constitutional requirements is made based on representative embodiments of the present invention, but it should not be construed that the present invention is limited to those embodiments.

In the present specification, numerical value ranges expressed by "to" mean that the numerical values described before and after "to" are included as a lower limit and an upper limit, respectively.

$Re(\lambda)$ and $Rth(\lambda)$ represent an in-plane retardation and a thickness direction retardation at a wavelength λ, respectively.

The retardations $Re(\lambda)$ and $Rth(\lambda)$ are obtained using AxoScan (manufactured by Axometrics, Inc.). The in-plane retardation $Re(\lambda)$ is a value measured by making light having a wavelength of λ nm to be incident onto a film in a direction normal to the surface of the film. By inputting the average refractive index $((nx+ny+nz)/3)$ and the film thickness (d (μm)) with AxoScan, a slow-axis direction(°) is calculated.

Thickness direction phase difference $Rth(\lambda)=((nx+ny)/2-nz) \times d$

In the present specification, the term "visible light" refers to 380 nm to 780 nm.

In the present specification, the angle (for example, an angle such as "90°") and the relationship thereof (for example, "orthogonal", "parallel", and "crossing at 45°") include a range of error allowed in the technical field to which the present invention belongs. For example, the range means a range within an exact angle ± less than 10°, and an error with the exact angle is preferably 5° or less, and more preferably 3° or less.

In the present specification, the term "slow axis" of a phase difference film or the like means a direction in which the refractive index becomes the maximum.

In addition, in the present specification, regarding the numerical values, numerical value ranges, and qualitative expressions (for example, expressions such as "equivalent" and "equal") indicating the optical properties of each member such as a phase difference film and a liquid crystal layer, it is to be understood that the numerical values, numerical value ranges and properties including errors generally accepted for liquid crystal display devices and members used therefor are indicated.

The Nz factor is a value calculated by $Nz=(nx-nz)/(nx-ny)$ or a value calculated by $Nz=Rth(550)/Re(550)+0.5$.

Here, nx represents a refractive index in a slow-axis direction in the plane of the optical film, and this direction is set to an X-axis. ny represents a refractive index in a direction orthogonal to nx in the plane, and this direction is set to a Y-axis. nz represents a refractive index in a direction (a thickness direction of the optical film) orthogonal to nx and ny, and this direction is set to a Z-axis.

<<Optical Film>>

Hereinafter, an optical film and a method for producing an optical film according to embodiments of the present invention will be described with reference to the drawings. In the present specification, the optical film means a film which can be used for an optical member such as various display devices, light emitting devices, polarizing plates, various optical elements such as a λ/4 plate and a λ/2 plate.

FIG. 1 shows a schematic cross-sectional view of an embodiment of an optical film of the present invention. An optical film 10 of an embodiment has an alignment layer 12 and a cholesteric liquid crystal layer 13 on a support 11, and an Nz factor of the cholesteric liquid crystal layer 13 is 0.2 or more and 0.75 or less. The Nz factor is preferably 0.3 or more and 0.65 or less and more preferably 0.4 or more and 0.6 or less.

The cholesteric liquid crystal layer 13 has a layered structure in which rod-like liquid crystal molecules are overlapped in layers, and the layers are integrated such that the arrangement direction of the molecules is helical, and the helical axes in the plane are always arranged in a uniaxial direction. The cholesteric liquid crystal layer 13 has a uniform lying helix (ULH) alignment in which the helical axes are aligned in a direction parallel to the surface of the film.

In addition, the optical film 10 is configured as a uniaxially stretched film obtained by uniaxially stretching an optical film in which a cholesteric liquid crystalline phase is fixed in a direction orthogonal to the helical axis.

It is preferable that the optical film has a film thickness of 30 μm or less from the viewpoint of thinning of the member. From the viewpoint of production suitability, the film thickness is preferably 5 μm or more. In a case of using a λ/4 plate or a λ/2 plate, the film thickness is appropriately set according to the purpose.

Since the Nz factor of the optical film according to the embodiment of the present invention is 0.2 or more and 0.75 or less, for example, the optical film is useful as a λ/4 plate for an organic EL display device or a λ/2 plate of an IPS mode liquid crystal display device.

(Cholesteric Liquid Crystal Layer)

The cholesteric liquid crystal layer is a layer in which a cholesteric liquid crystalline phase is fixed. Although this cholesteric liquid crystal layer may contain any of a reverse wavelength dispersive liquid crystal compound and a forward wavelength dispersive liquid crystal compound, it is preferable that the cholesteric liquid crystal layer contain a reverse wavelength dispersive liquid crystal compound.

The birefringence Δn of an optically isotropic material differs depending on the wavelength λ, and generally, forward wavelength dispersibility in which the birefringence Δn is high on the low wavelength side of the transmitted light and the birefringence Δn is low on the long wavelength side is exhibited. Therefore, a component having a shorter wavelength has a larger change in color. On the other hand, the reverse wavelength dispersive liquid crystal compound has reverse wavelength dispersibility in which the birefringence Δn is low on the low wavelength side of the transmitted light and the birefringence Δn is high on the long wavelength side. For this reason, it is possible to produce an optical film having a small change in Δn/λ which is a value obtained by dividing birefringence by a wavelength in a wide wavelength range by using a reverse wavelength dispersive liquid crystal compound.

The film thickness of the cholesteric liquid crystal layer is preferably 1 to 30 μm, more preferably 1.5 to 20 μm, and even more preferably 2 to 15 μm.

In addition, in a case of a λ/4 plate, the Re of the cholesteric liquid crystal layer preferably satisfies 120 nm≤Re(550)≤150 nm and more preferably satisfies 130 nm≤Re(550)≤140 nm. In a case of a λ/2 plate, the Re of the cholesteric liquid crystal layer preferably satisfies 200 nm≤Re(550)≤320 nm and more preferably satisfies 230 nm≤Re(550)≤300 nm.

In a case of a λ/4 plate, the Rth of the cholesteric liquid crystal layer preferably satisfies −45 nm≤Rth(550)≤45 nm and more preferably satisfies −25 nm≤Rth(550)≤25 nm. In a case of a λ/2 plate, the Rth of the cholesteric liquid crystal layer preferably satisfies −100 nm≤Rth(550)≤100 nm and more preferably satisfies −50 nm≤Rth(550)≤50 nm. Within these ranges, the Nz factor can be set to 0.2 or more and 0.75 or less and in a case where the optical film is incorporated into a display device, the effect of the present invention can be more effectively exhibited.

Although there is no particular limitation on the method for producing an optical film in which the cholesteric liquid crystalline phase is fixed, for example, the methods described in JP1989-133003A (JP-H01-133003A), JP3416302B, JP3363565B, and JP1996-271731A (JP-H08-271731A) can be used.

Hereinafter, the method described in JP1996-271731A (JP-H08-271731A) will be described.

The optical film is formed by, for example, curing a polymerizable composition containing a rod-like liquid crystal compound and uniaxially stretching the composition. Here, the rod-like liquid crystal compound which is a polymerizable composition component used to produce the optical film, other components, and a solvent will be described.

—Rod-Like Liquid Crystal Compound—

First, a rod-like liquid crystal compound which is a material of an optical film obtained by fixing a cholesteric liquid crystalline phase will be described.

As the rod-like liquid crystal compound, for example, those described in JP1999-513019 (JP-H11-513019A) and JP2007-279688A can be preferably used, but there is no limitation thereto.

Examples of the rod-like liquid crystal compound are shown below, but the invention is not limited thereto.

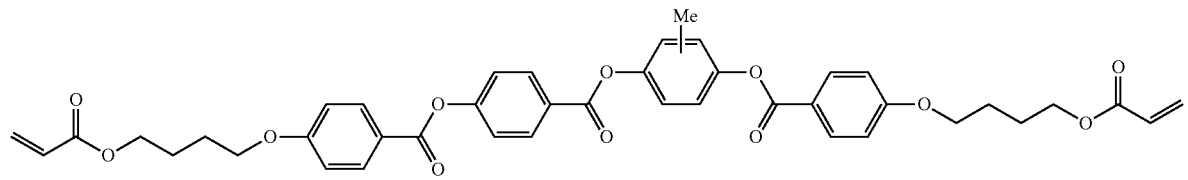

Rod-Like compound 18-1

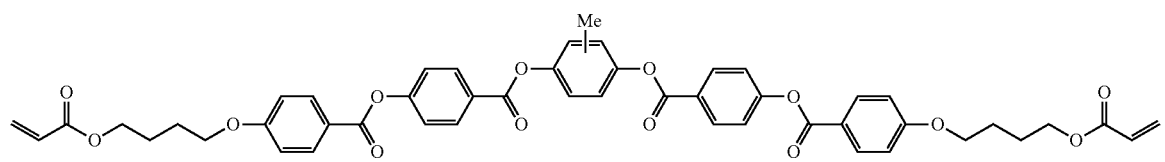

Rod-like compound 18-2

The rod-like liquid crystal compound is more preferably a reverse wavelength dispersion rod-like liquid crystal compound. Although the reverse dispersion rod-like liquid crystal compounds shown below can be preferably used, the present invention is not limited thereto.

erizable group of the chiral agent is also preferably an unsaturated polymerizable group, an epoxy group or an aziridinyl group, more preferably an unsaturated polymerizable group, and particularly preferably an ethylenically unsaturated polymerizable group.

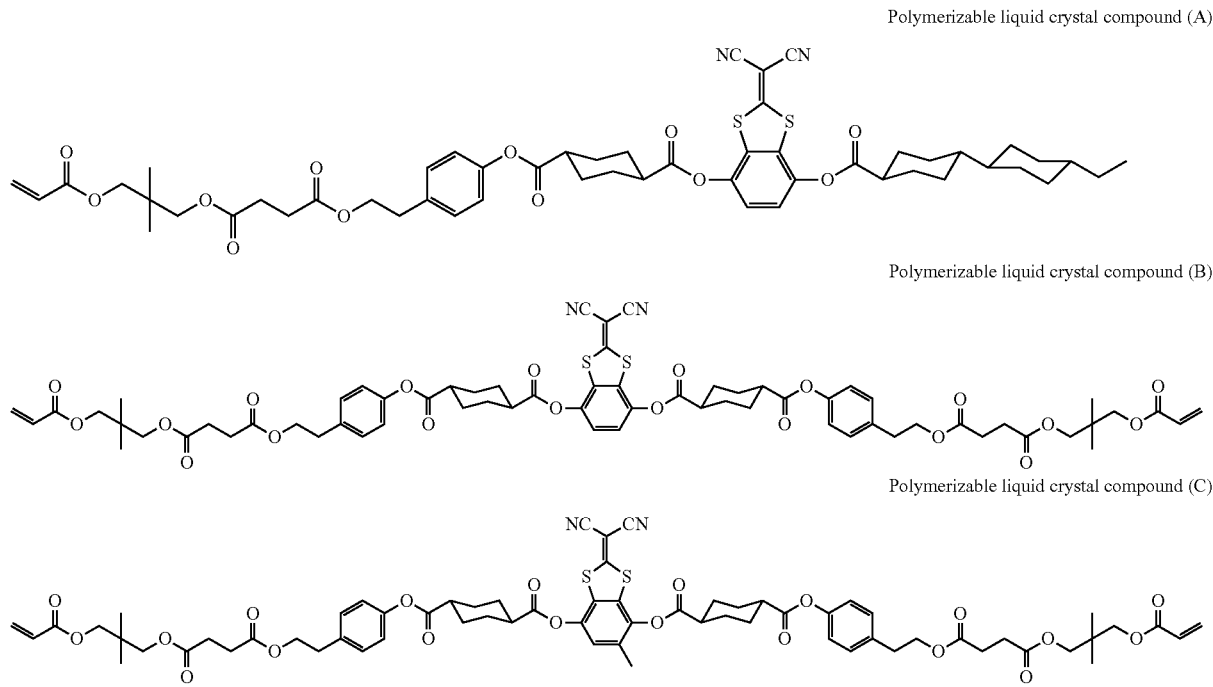

Polymerizable liquid crystal compound (A)

Polymerizable liquid crystal compound (B)

Polymerizable liquid crystal compound (C)

—Other Components—

The polymerizable composition used to form the optical film formed by fixing the cholesteric liquid crystalline phase includes, in addition to the rod-like liquid crystal compound, other components such as a chiral agent, an alignment control agent, a polymerization initiator, and an alignment aid.

The chiral agent can be selected from known various chiral agents (for example, Liquid Crystal Device Handbook, Chapter 3, Section 4-3, chiral agents for TN and STN, page 199, edited by Japan Society for the Promotion of Science, the 142 Committee, 1989). The chiral agent generally contains an asymmetric carbon atom, but an axially asymmetric compound or planarly asymmetric compound, which contains no asymmetric carbon atom, can be also used as the chiral agent. Examples of the axially asymmetric compound or planarly asymmetric compound include binaphthyl, helicene, paracyclophane, and derivatives of these compounds. The chiral agent may have a polymerizable group. In a case where the chiral agent has a polymerizable group, and the rod-like liquid crystal compound to be used in combination also has a polymerizable group, by the polymerization reaction of the chiral agent having a polymerizable group and the polymerizable rod-like liquid crystal compound, a polymer having repeating units derived from the rod-like liquid crystal compound and repeating units derived from the chiral agent can be formed. In this aspect, the polymerizable group contained in the chiral agent having a polymerizable group is preferably the same group as the polymerizable group contained in the polymerizable rod-like liquid crystal compound. Accordingly, the polym- The chiral agent may also be a liquid crystal compound.

Examples of chiral agents having a strong twisting force include chiral agents described in JP2010-181852A, JP2003-287623A, JP2002-080851A, JP2002-080478A, and JP2002-302487A, and these chiral agents can be preferably used in the present invention. Further, for isosorbide compounds described in these published publications, isomannide compounds of the corresponding structure can also be used, and for isomannide compounds described in these publications, isosorbide compounds of the corresponding structure can also be used.

Examples of the alignment control agent include alignment control agents of fluoroalkyl+hydrophilic type exemplified in JP2004-331812A can preferably be used.

Specific examples of the polymerization initiator among the photopolymerization initiators include α-carbonyl compounds (described in U.S. Pat. Nos. 2,367,661 and 2,367,670A), acyloin ethers (described in U.S. Pat. No. 2,448,828A), α-hydrocarbon-substituted aromatic acyloin compounds (described in U.S. Pat. No. 2,722,512A), polynuclear quinone compounds (described in U.S. Pat. Nos. 3,046,127A and 2,951,758A), combinations of triaryl imidazole dimer and p-aminophenyl ketone (described in U.S. Pat. No. 3,549,367A), acridine and phenazine compounds (described in JP1985-105667A (JP-S60-105667A), and U.S. Pat. No. 4,239,850A), oxadiazole compounds (described in U.S. Pat. No. 4,212,970A), and acylphosphine oxide compounds (described in JP1988-040799B (JP-S63-040799B), JP1993-029234B (JP-H05-029234B), JP1998-095788A (JP-H10-095788A), and JP1998-029997A (JP-H10-029997A).

—Solvent—

As the solvent of the composition for forming each optical film, an organic solvent is preferably used. Examples of the organic solvent include amides (for example, N,N-dimethyl formamide), sulfoxides (for example, dimethyl sulfoxide), heterocyclic compounds (for example, pyridine), hydrocarbons (for example, benzene and hexane), alkyl halides (for example, chloroform and dichloromethane), esters (for example, methyl acetate and butyl acetate), ketones (for example, acetone, methyl ethyl ketone, and cyclohexanone), and ethers (for example, tetrahydrofuran and 1,2-dimethoxyethane). Alkyl halides and ketones are preferable. Two or more kinds of organic solvents may be used in combination.

Next, the members provided in the optical film according to the embodiment of the present invention, or the members used in the method for producing an optical film will be described.

<Support>

As the support of the optical film, a transparent support is preferable, and a polyacrylic resin film of polymethyl methacrylate or the like, a cellulose-based resin film of cellulose triacetate or the like, and a cycloolefin-based polymer film [for example, product name "Arton", manufactured by JSR Company, product name "Zeonor", manufactured by Nippon Zeon Co., Ltd.] and the like can be used.

Although the optical film is described as an optical film including a support in FIG. 1, the optical film may not include a support. For example, using glass or a transparent film as a support in a case of forming an optical film with (hereinafter, referred to as a temporary support), the optical film may be peeled from the temporary support to obtain the optical film according to the embodiment of the present invention.

There is no particular limitation on the support used at the time of such film formation, but it is preferable for the support to have physical properties that can endure stretching, peeling, and the like in the production step described later.

<Alignment Layer>

In order to obtain the desired liquid crystal alignment, it is preferable to provide an alignment layer on the forming surface of the optical film (the application surface of the polymerizable composition) in order to obtain the desired cholesteric liquid crystalline phase.

The alignment layer can be provided by means such as rubbing treatment of an organic compound (preferably a polymer), oblique deposition of an inorganic compound, formation of a layer having a microgroove, and photoalignment. Further, the alignment layer in which an alignment function is generated by application of an electric field, application of a magnetic field, or light irradiation is also known. The alignment layer is preferably formed by rubbing the surface of a polymer film. In a case where the optical film is peeled off from the temporary support after the optical film is formed, it is preferable to peel off the alignment layer together with the temporary support.

Depending on the kind of polymer used for the support, the support can be functioned as an alignment layer by a direct alignment treatment (for example, a rubbing treatment), even without providing the alignment layer. One example of such a support is polyethylene terephthalate (PET).

—Rubbing Treatment—

The surface of the alignment layer or the support is preferably subjected to a rubbing treatment. The rubbing treatment can be performed generally by rubbing the surface of a film mainly formed of a polymer with paper or cloth in a certain direction.

A general rubbing treatment method is described in, for example, "Liquid Crystal Handbook" (Maruzen, published on Oct. 30, 2000).

As a method for changing the rubbing density, the method described in "Liquid Crystal Handbook" (issued by Maruzen Co., Ltd.) can be used. The rubbing density (L) is quantified by Formula (A).

$$L=Nl(1+2\pi rn/60\ v)$$ Formula (A)

In Formula (A), N represents the number of times of rubbing, l represents the contact length of the rubbing roller, r represents the radius of the roller, n represents the rotation speed of the roller (rpm), and v represents the stage shifting speed (speed per second).

In order to increase the rubbing density, the number of times of rubbing may be increased, the contact length of the rubbing roller may be increased, the radius of the roller may be increased, the rotation speed of the roller may be increased, and the stage shifting speed may be increased. On the other hand, in order to decrease the rubbing density, the above-mentioned methods may be reversed. Moreover, the description in JP4052558B can also be referred to as the conditions at the rubbing treatment.

<<Method for Producing Optical Film>>

The method for producing an optical film will be described. The optical film is formed by, for example, a step (1) of forming a coating film formed of a polymerizable composition including a rod-like liquid crystal compound, a step (2) of curing the coating film, and a step (3) of uniaxially stretching the cured coating film.

In the step (1), first, a coating film formed of a polymerizable composition including a rod-like liquid crystal compound (hereinafter, sometimes referred to as a polymerizable liquid crystal composition) is formed on the surface of the alignment layer on the support. The polymerizable liquid crystal composition is preferably prepared as a coating liquid in which a material is dissolved and/or dispersed in a solvent. The coating liquid can be applied by various methods such as a wire bar coating method, an extrusion coating method, a direct gravure coating method, a reverse gravure coating method, and a die-coating method. In addition, a liquid crystal composition can be jetted from a nozzle using an ink jet device to form a coating film.

Next, the polymerizable liquid crystal composition applied to the surface to form a coating film is brought into a state of a cholesteric liquid crystalline phase. In an aspect in which the polymerizable liquid crystal composition is prepared as a coating liquid including a solvent, a cholesteric liquid crystalline phase may be obtained by drying a coating film to remove the solvent. In addition, the coating film may be heated, if desired, to achieve a temperature for a transition to the cholesteric liquid crystalline phase. For example, by once heating the coating film to the temperature of an isotropic phase and then cooling the coating film to a cholesteric liquid crystalline phase transition temperature (the phase transition temperature between the isotropic phase and the cholesteric liquid crystalline phase), the state of the cholesteric liquid crystalline phase can be stably achieved. The liquid crystalline phase transition temperature of the polymerizable liquid crystal composition is preferably in a range of 10° C. to 250° C. and more preferably in a range of 10° C. to 150° C. from the viewpoint of production suitability and the like. In a case where the temperature is lower than 10° C., a cooling step or the like may be required to lower the temperature to a temperature range in which a liquid crystalline phase is exhibited. In addition, from the viewpoint of the efficient utilization of thermal energy, the heat resistance of the substrate, and the like, it is preferable to set the heating temperature of the coating film to 200° C. or lower. The temperature at this time is the film surface temperature and can be measured with OPTEX PT-2LD or the like.

The optical film obtained by fixing a cholesteric liquid crystalline phase can be formed by a suitable method such as a method of direct application through an appropriate alignment layer such as an oblique deposition layer of polyimide, polyvinyl alcohol, or SiO, or a method of application to a support which is not altered at the alignment temperature of the liquid crystal and is formed of a transparent film or the like through an alignment layer as required. In addition, it is also possible to adopt a method for superposing cholesteric liquid crystal layers through an alignment layer.

The direction of revolution of the cholesteric liquid crystalline phase can be adjusted by the kind of liquid crystal to be used or the kind of chiral agent to be added, and the helical pitch (that is, selective reflection wavelength) can be adjusted by the concentration of these materials. In addition, it is known that the wavelength of a specific region reflected by each optical film can be shifted by various factors of the production method, and in addition to the concentration of the chiral agent and the like, the wavelength can be shifted depending on conditions such as temperature, illuminance, and irradiation time when the cholesteric liquid crystalline phase is fixed.

In addition, the cholesteric liquid crystal layer can be realized by subjecting the alignment film to an alignment treatment such as rubbing or ultraviolet alignment so that the ULH alignment in which the helical axes are aligned in a direction parallel to the surface of the film is obtained. In general, the alignment restriction force is adjusted not to be too great, so as not to be perfect horizontal alignment (planar alignment) while performing an alignment treatment in which liquid crystal molecules are aligned in a direction orthogonal to the helical axis. In this manner, it is possible to achieve ULH alignment in which the helical axes are aligned in a direction parallel to the surface of the film. In this case, generally, the helical axis is orthogonal or parallel to an alignment treatment direction in the plane. The alignment restriction force can be adjusted by the rubbing intensity, the ultraviolet irradiation energy, or the like. In addition, in a case where the alignment control agent is added such that the liquid crystal on the air interface side does not become horizontal or vertical with respect to the interface, ULH alignment in which the helical axes are aligned in a direction parallel to the surface of the film can be achieved. As an example, JP4275087B or the like may be mentioned.

Next, in the step (2), the coating film in the cholesteric liquid crystalline phase is irradiated with ultraviolet rays to cause a curing reaction to proceed. A light source such as a UV lamp is used for ultraviolet irradiation. In this step, the curing reaction of the polymerizable liquid crystal composition proceeds by irradiating the film with ultraviolet rays, and the cholesteric liquid crystalline phase is fixed.

The amount of irradiation energy of ultraviolet rays is not particularly limited, but generally, is about 100 mJ/cm$^2$ to 800 mJ/cm$^2$ is preferable. In addition, the time for ultraviolet irradiation to the coating film is not particularly limited, but is determined from the viewpoint of both sufficient intensity strength and productivity of the cured film.

The ultraviolet irradiation may be performed under heating conditions to promote the curing reaction. In addition, the temperature at the time of the ultraviolet irradiation is preferably maintained in a temperature range in which the cholesteric liquid crystalline phase is exhibited so that the cholesteric liquid crystalline phase is not disturbed. Further, since the oxygen concentration in the atmosphere is related to the degree of polymerization, in a case where the degree of polymerization cannot reach the desired degree of polymerization in air and the film hardness is insufficient, the oxygen concentration in the atmosphere is preferably reduced by a method such as nitrogen substitution. A preferable oxygen concentration is preferably 10% or less, more preferably 7% or less, and most preferably 3% or less. The reaction rate of the curing reaction (for example, polymerization reaction) which proceeds by ultraviolet irradiation is preferably 70% or more, more preferably 80% or more, and even more preferably 90% or more from the viewpoint of maintaining the mechanical strength of the layer, suppressing the outflow of an unreacted material from the layer, and the like. In order to improve the reaction rate, a method of increasing the irradiation amount of ultraviolet rays to be irradiated or polymerization under a nitrogen atmosphere or under heating conditions is effective. In addition, after polymerization performed once, a method of further promoting the reaction by a thermal polymerization reaction by maintaining a state of a temperature higher than the polymerization temperature or a method of performing irradiation with ultraviolet rays again can also be used. The reaction rate can be measured by comparing the values of the absorption intensity of the infrared vibrational spectrum of the reactive group (for example, a polymerizable group) before and after the reaction progress.

Here, the state in which the liquid crystalline phase is "fixed" is the most typical and preferable aspect in which the alignment of the liquid crystal compound in the cholesteric liquid crystalline phase is maintained. Without being limited thereto, specifically, the above state means a state in which this layer has no fluidity in a temperature range of usually 0° C. to 50° C. and more severe conditions of −30° C. to 70° C., and the fixed alignment form can be continuously kept stable without causing a change in the alignment form by an external field or an external force. It is preferable to fix the alignment state of the cholesteric liquid crystalline phase by the curing reaction that proceeds by ultraviolet irradiation. In the present invention, as long as the optical properties of the cholesteric liquid crystalline phase are maintained in the layer, and finally the liquid crystal composition in each optical film does not have to exhibit liquid crystallinity any more. For example, the liquid crystal composition may have a high molecular weight due to the curing reaction and may no longer have liquid crystallinity.

Finally, in the step (3), the cured layer obtained in the step (2) is uniaxially stretched. Stretching is performed in a direction crossing the helical axes of the laminated liquid crystal molecules of the cholesteric liquid crystalline phase. An angle formed between the helical axis and the stretching axis is preferably in a range of 85° to 95° and it is more preferable that stretching is performed in a direction in which helical axis and the stretching axis are orthogonal to each other.

For uniaxial stretching, known methods can be used.

A film having the produced coating film of the cholesteric liquid crystalline phase is longitudinally stretched at a desired stretching ratio in a longitudinal uniaxial stretching machine. Alternatively, the film is stretched at a desired stretching ratio in a desired uniaxial direction using a tenter type stretching machine. The uniaxially stretched film may be formed into a roll film by cutting off both ends in front of a winding section and winding the film in the winding section.

The intake air temperature at the time of stretching, the film surface temperature, and the stretching speed can be appropriately adjusted according to the desired stretching ratio.

The film surface temperature at the time of stretching is preferably a glass transition point Tg of the support on which the cholesteric liquid crystalline phase is formed −40° C. to Tg+20° C. and more preferably Tg−20° C. to Tg+10° C.

Next, the relationship between the optical properties of the optical film and the stretching ratio will be described with reference to FIG. 2 and FIGS. 3A, 3B, and 3C. In FIG. 2 and FIGS. 3A, 3B, and 3C, the description will be made while the normal direction of the surface of the film is set to the Z-axis, the depth direction is set to the Y-axis, and the direction orthogonal to the Z and Y axes is set to the X-axis.

Figure 2:
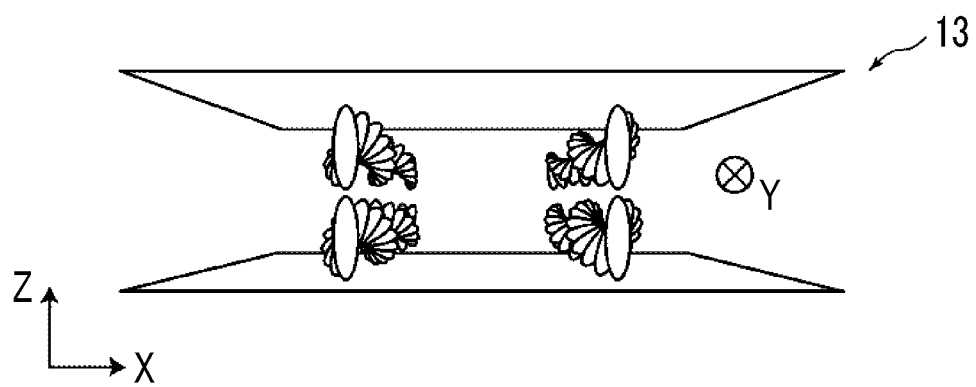
FIG. 2 is a view for explaining the optical properties before stretching of the optical film of the present invention.
Figure 2:
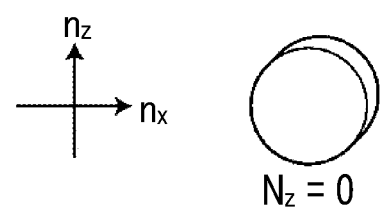

As shown in FIG. 2, the cholesteric liquid crystal layer obtained after the step (2) has ULH alignment in which helical axes are aligned in a direction parallel to the surface of the film. At this time, in a case where the helical pitch of the ULH alignment is set to have a shorter wave than visible light, selective reflection does not occur in the visible light range, and thus the layer can function as a phase difference film for visible light. In this case, in visible light, the helical-axis direction (in FIG. 2, the helical-axis direction is set to the Y-axis direction) has the lowest refractive index, and becomes a negative uniaxial birefringent body. Further, in the present invention, by stretching this layer, the layer becomes a biaxial birefringent body as shown below.

As shown in FIG. 2, in the cholesteric liquid crystal layer, the refractive index $n_z$ in the Z-axis direction and the refractive index $n_x$ in the X-axis direction have the same value, and the refractive index $n_y$ in the Y-axis direction is smaller than the refractive index $n_z$ in the Z-axis direction and the refractive index $n_x$ of the X-axis direction. That is, the birefringence ellipsoid viewed from an XZ plane is circular (the lower view in FIG. 2). At this time, $n_x=n_z>n_y$, and Nz=0.

Next, in the step (3), as shown in FIGS. 3A, 3B, and 3C, in a case where the cured film is stretched in the X-axis direction, the refractive index $n_x$ in the X-axis direction is increased, and thus the relationship among the refractive index $n_x$ in the X-axis direction, the refractive index $n_y$ in Y-axis direction, and the refractive index $n_z$ in the Z-axis direction is $n_x>n_z>n_y$. As shown in FIG. 3A, in a case where the film is stretched by 20%, the birefringence ellipsoid viewed from the XZ plane swells in the X-axis direction, and Nz=0.2 (refer to the lower view in FIG. 3A). Further, as shown in FIGS. 3A and 3B, in a case where the stretching ratio is increased, the birefringence ellipsoid swells in the X-axis direction and the Nz factor is increased. In the example in FIG. 3B, by stretching the film by 50%, the Nz factor is 0.5, and by stretching the film by 80%, the Nz factor is 0.75.

Thus, according to the method for producing an optical film according to the embodiment of the present invention, since the cholesteric liquid crystal layer of ULH alignment is formed into a film having an Nz factor of 0.2 or more and 0.75 or less by stretching the film by 20% to 80% in a direction orthogonal to the helical axis, and the Nz factor has a value close to 0.5, it is possible to produce an optical film with reduced changes in brightness and color depending on the viewing angle.

<<Use of Optical Film>>

The optical film according to the embodiment of the present invention is useful as, for example, a λ/2 optical compensation film that optically compensates a liquid crystal cell, or as a broadband λ/4 antireflection film used in an organic EL display device. By controlling the film thickness of the optical film, a λ/2 plate or a λ/4 plate can be obtained. A λ/2 plate may be formed by laminating two λ/4 plates.

The optical film according to the embodiment of the present invention can be suitably used as an optical compensation film of an IPS mode liquid crystal display device or a liquid crystal display device and a change in tint when visually recognized in the oblique direction or light leakage during a black display can be improved.

(Adhesive)

In a case of preparing an optical film, a display device, or the like, an adhesive may be used for bonding the respective members. In the present specification, "adhesion" is used in the concept that includes "pressure sensitive adhesiveness". The adhesive not particularly limited, but examples thereof include a polyvinyl alcohol-based adhesive, an aqueous boron compound solution, a curable adhesive of an epoxy compound containing no aromatic ring in the molecule, as described in JP2004-245925A, an active energy ray-curable adhesive having a photopolymerization initiator having a molar light absorption coefficient of 400 or more at a wavelength of 360 to 450 nm and an ultraviolet curable compound as essential components, as described in JP2008-174667A, and an active energy ray-curable adhesive including (a) a (meth)acryl-based compound having two or more (meth)acryloyl groups in the molecule, (b) a (meth)acryl-based compound having a hydroxyl group in the molecule and one polymerizable double bond, and (c) a phenol ethylene oxide-modified acrylate or nonyl phenol ethylene oxide-modified acrylate in the total amount of 100 parts by mass of the (meth)acryl-based compound described in JP2008-174667A.

Furthermore, the polyvinyl alcohol-based adhesive is an adhesive containing a modified or non-modified polyvinyl alcohol. The polyvinyl alcohol-based adhesive may contain a modified or non-modified polyvinyl alcohol and a cross-linking agent. Specific examples of the adhesive include an aqueous solution of a polyvinyl alcohol or a polyvinyl acetal (for example, polyvinyl butyral), and a latex of a vinyl-based polymer (for example, polyvinyl chloride, polyvinyl acetate, and polybutyl acrylate). A particularly preferable adhesive is an aqueous solution of a polyvinyl alcohol. Here, the polyvinyl alcohol is preferably in the state of being completely saponified.

The film thickness of the adhesive layer formed by the adhesive is preferably 0.01 to 10 μm, and particularly preferably 0.05 to 5 μm, in terms of a dry film thickness.

<<Display Device>>

A display device includes the optical film. As examples of the display device, an organic EL display device and an IPS mode liquid crystal display device will be described.

<Organic EL Display Device>

Figure 4:
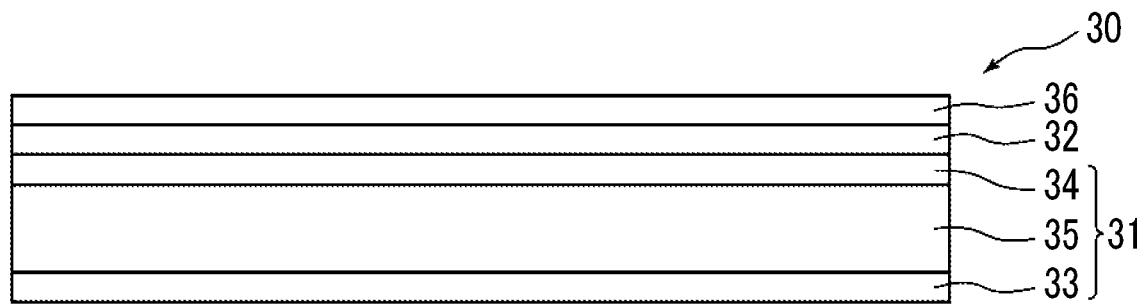
FIG. 4 is a schematic cross-sectional view showing an organic EL display device.

An embodiment of the organic EL display device will be described. FIG. 4 shows a schematic cross-sectional view showing an embodiment of the organic EL display device.

As shown in FIG. 4, an organic EL display device 30 includes an antireflection film (λ/4 plate) 32 and a polarizer 36 on an organic EL panel 31. The antireflection film 32 is the optical film. The polarizer 36 side is a visible side. The organic EL panel 31 has a light emitting layer 35 arranged between a pair of electrodes of a rear surface electrode 33 and a transparent electrode 34. Holes injected from the rear surface electrode 33 and electrons injected from the transparent electrode 34 are recombined in the light emitting layer 35 to emit light by excitation of a fluorescent substance or the like. The light emitted from the light emitting layer 35 is emitted from the transparent electrode 34 directly or by reflection on the rear surface electrode 33. The organic EL display device has an antireflection function due to the antireflection film 32 and the polarizer 36. Specifically, incidence rays from outside are converted into linearly polarized light by the polarizer 36, and the linearly polarized light is further converted into circularly polarized light by the antireflection film 32. The circularly polarized light is converted into circularly polarized light of reverse rotation to reflected incidence rays by the transparent electrode 34. Since the circularly polarized light is converted into linearly polarized light in a direction orthogonal to the incidence rays by the antireflection film 32, the circularly polarized light does not pass through the polarizer 36.

The organic EL panel 31 is a member formed by a plurality of organic compound thin films, and may have, in addition to the light emitting layer 35, a hole injecting layer, a hole transporting layer, an electron injecting layer, an electron transporting layer, a protective layer, and the like. Each of these layers may have different functions from each other. For the formation of the respective layers, various materials can be used.

The rear surface electrode 33 is provided for supplying holes to the hole injecting layer, the hole transporting layer, the light emitting layer, and the like and can be formed of a metal, an alloy, a metal oxide, an electroconductive compound, or a mixture thereof. The rear surface electrode is preferably formed of a material having a work function of 4 eV or higher. Specific examples of the material include an electroconductive metal oxide such as tin oxide, zinc oxide, indium oxide, and indium-tin oxide (ITO); a metal such as gold, silver, chromium, and nickel; a mixture or a laminate of those metals and electroconductive metal oxides; an inorganic electroconductive substance such as copper iodide and copper sulfide; an organic electroconductive material such as polyaniline, polythiophene, and polypyrrole; and a laminate of these materials and ITO. Preferable are electroconductive metal oxides, and particularly, ITO is preferable form the viewpoints of productivity, high electrical conductivity, transparency, and the like. Although the film thickness of the rear surface electrode 33 can be appropriately selected depending on the material thereof, it is usually preferably 10 nm to 5 μm, more preferably 50 nm to 1 μm, and still more preferably from 100 nm to 500 nm.

In the organic EL display device, the optical film according to the embodiment of the present invention is provided as an antireflection film and thus front contrast and oblique tint are improved.

<IPS Mode Liquid Crystal Display Device>

Figure 5:
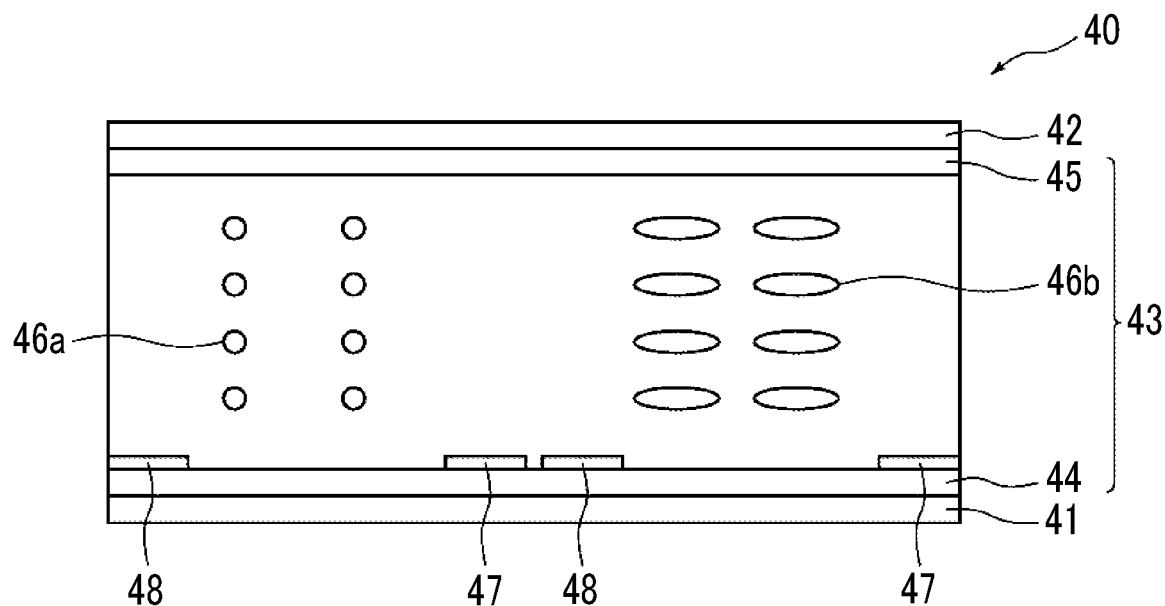
FIG. 5 is a schematic cross-sectional view showing an IPS mode liquid crystal display device of the present invention.

Next, an IPS mode liquid crystal display device including the optical film of the embodiment of the present invention will be described. FIG. 5 shows a schematic cross-sectional view of an embodiment of an IPS mode liquid crystal display device.

As shown in FIG. 5, an IPS mode liquid crystal display device 40 of an embodiment includes an IPS mode liquid crystal cell 43 arranged between two polarizing plates 41 and 42. The polarizing plate 42 (λ/2 plate) is the optical film according to the embodiment of the present invention. In the liquid crystal cell 43, liquid crystal molecules (46a and 46b) are sealed between glass substrates 44 and 45. Transparent anodes 47 and transparent cathodes 48 are formed on the glass substrate 44. In a state in which voltage is not applied, liquid crystal molecules are arranged parallel to the transparent anode 47 and the transparent cathode 48 like the liquid crystal molecules 46a, but in a state in which voltage is applied, liquid crystal molecules are horizontally rotated by 90 degrees and aligned over the transparent anode 47 and the transparent cathode 48 like the liquid crystal molecules 46b. Since the liquid crystal molecules are rotated by 90 degrees in the in-plane direction by non-voltage application and voltage application, transmission or shielding is made between two polarizing plates.

In the IPS mode liquid crystal display device, the liquid crystal molecules are rotated in a horizontal plane with respect to the glass substrate. Therefore, since the liquid crystal molecules are not obliquely arranged, a change in optical properties depending on the viewing angle is small and a wide viewing angle is obtained. By using the optical film of the embodiment of the present invention for such an IPS mode liquid crystal display device, the viewing angle is further improved.

EXAMPLES

The characteristics of the present invention will be described below in further detail based on Examples and Comparative Examples. The materials, amounts used, ratios, treatments, treatment procedures, and the like shown in the examples below can be modified as appropriate in the range of not departing from the spirit of the present invention. Therefore, the scope of the present invention should not be construed as being limited to the following specific examples.

Example 1

<Preparation of Temporary Support>

Pellets of [a mixture of 90 parts by mass of an acrylic resin having a lactone ring structure represented by Formula (II) {copolymerizable monomer mass ratio=methyl methacrylate/2-(hydroxymethyl)methyl acrylate=8/2, a lactone ring formation rate: about 100%, a content ratio of the lactone ring structure: 19.4%, a weight-average molecular weight: 133,000, a melt flow rate: 6.5 g/10 min (240° C., 10 kgf), Tg: 131° C.}, and 10 parts by mass of an acrylonitrile-styrene (AS) resin {TOYO AS AS20, manufactured by TOYO STYRENE Co., Ltd.}; Tg: 127° C.] were supplied to a twin screw extruder, and melted and extruded in a sheet form at about 280° C. Then, in a longitudinal uniaxial stretching machine, longitudinal stretching was performed at an air supply temperature of 130° C., a film surface temperature of 120° C., a stretching speed of 30%/min, and a stretching ratio of 35%. Thereafter, in a tenter type stretching machine, cross-direction stretching was performed at an air supply temperature of 130° C., a film surface temperature of 120° C., a stretching speed of 30%/min, and a stretching ratio of 35%, and both end portions were cut off in front of the winding section, and wound up as a roll film with a length of 4000 m to obtain a long temporary support having a thickness of 40 μm.

(II)

In Formula (II), $R^1$ represents a hydrogen atom, and $R^2$ and $R^3$ represent a methyl group.

<Formation of Alignment Layer>

An alignment layer coating liquid (A) having the following composition was continuously applied to the temporary support with a #14 wire bar. The coated surface was dried with hot air at 60° C. for 60 seconds, further dried with hot air at 100° C. for 120 seconds, and subjected to rubbing to form an alignment layer. The rubbing direction is a direction orthogonal to the in-plane helical axis of the cholesteric liquid crystal (X-axis direction).

compound (A)

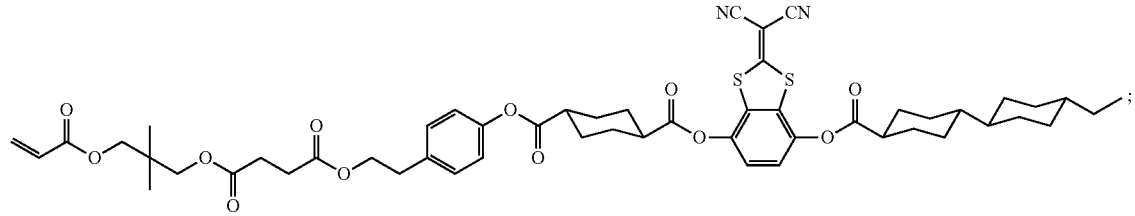

Polymerizable liquid crystal compound compound (C)

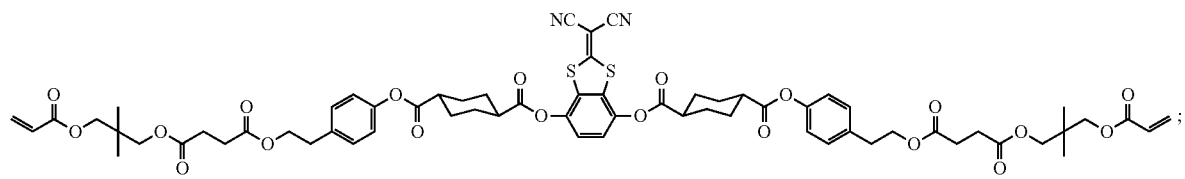

Polymerizable liquid crystal compound fluorine-based polymer (E)

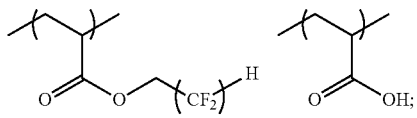

Leveling agent

—Composition of Alignment Layer Coating Liquid (A)—

| | |
|---|---|
| Modified polyvinyl alcohol shown below | 10 parts by mass |
| Water | 308 parts by mass |
| Methanol | 70 parts by mass |
| Isopropanol | 29 parts by mass |
| Photopolymerization initiator (IRGACURE 2959 (registered trademark), manufactured by BASF SE) | 0.8 parts by mass |

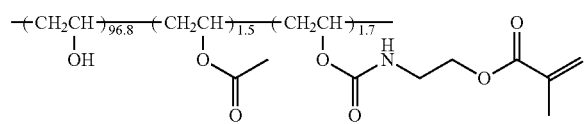

Modified Polyvinyl Alcohol

The compositional ratio of the modified polyvinyl alcohol is a molar fraction and the saponification degree is 96.8%.

<Formation of Liquid Crystal Layer>

(Preparation of Composition (1))

The following components were mixed to obtain a composition (1).

Polymerizable liquid crystal compound; compound (A) 50 parts by weight

Polymerizable liquid crystal compound; compound (C) 50 parts by weight

Chiral agent; LC-756 (manufactured by BASF SE) 4.5 parts by weight

Polymerization initiator: Irg-907 (manufactured by Ciba Specialty Chemicals) 3.0 parts by weight Leveling agent; fluorine-based polymer (E) 0.3 parts by weight Solvent; chloroform 300 parts by weight (Preparation of Coating Film)

The composition (1) was applied by a wire bar to the alignment layer prepared on the temporary support, dried by heating at 120° C. for 1 minute, and then cooled to 100° C. Next, polymerization was performed by irradiating the dried film with ultraviolet rays using a UV irradiation apparatus (EXECURE 3000, manufactured by HOYA CANDEO OPTRONICS CORPORATION) at an exposure dose of 200 mJ/cm$^2$ (based on 365 nm) while maintaining the alignment of the polymerizable liquid crystal compound to obtain a coating film (1). By observing the cross section of this coating film (1) with a scanning electron microscope, it was confirmed that ULH alignment was obtained, and it was confirmed that the film thickness and the cholesteric pitch were 5 μm and 300 nm, respectively.

<Stretching>

In a batch type stretching machine in which the four sides of the film prepared as described above was fixed with a tentering machine, the film was stretched by 20% in a direction orthogonal to the helical axis (X-axis direction) at an air supply temperature of 140° C., a film surface temperature of 130° C., and a deformation speed of 30%/min. Thereafter, the edges of the four sides were cut off, the layer of the coating film was bonded to a glass plate using a pressure sensitive adhesive SK DYNE 2057 (manufactured by Soken Chemical Co., Ltd.), and the temporary support was peeled off from the laminate to obtain a film of Example 1.

Example 2

A film of Example 2 was prepared in the same manner as in Example 1 except that the stretching ratio was set to 50%.

Example 3

A film of Example 3 was prepared in the same manner as in Example 1 except that the stretching ratio was set to 80%.

Comparative Example 1

A film of Comparative Example 1 was prepared in the same manner as in Example 1 except that stretching was not performed.

<Calculation of Nz Factor>
(Phase Difference (Retardation))

With regard to the phase difference film of each Examples and Comparative Examples prepared above, the in-plane retardation Re was obtained by three-dimensional birefringence measurement at a wavelength of 550 nm using an automatic birefringence meter KOBRA-WR (manufactured by Oji Scientific Instruments), and the thickness direction Rth was obtained by measuring Re while changing the inclination angle. At the same time, $Nz=(nx-nz)/(nx-ny)=Rth/Re+0.5$ was obtained.

Table 1 shows the measurement results of Comparative Example 1 and Examples 1 to 3.

TABLE 1

|  |  | Comparative Example 1 | Example 1 | Example 2 | Example 3 |
|---|---|---|---|---|---|
| Optical film | Liquid crystal alignment | ULH alignment 5 μm thickness pitch of 0.1 μm | ULH alignment 5 μm thickness pitch of 0.1 μm | ULH alignment 5 μm thickness pitch of 0.1 μm | ULH alignment 5 μm thickness pitch of 0.1 μm |
|  | Stretching ratio | 0% | 20% | 50% | 80% |
|  | Film thickness after stretching (μm) | 5 | 4.2 | 3.3 | 2.9 |
|  | Nz value | 0 | 0.2 | 0.5 | 0.75 |

<Mounting into Organic EL Display Device and Evaluation of Display Performance>

The optical film was mounted on an organic EL display device and the display performance was evaluated.

An example in which the optical film is used as an antireflection film (λ/4 plate) of an organic EL display device will be described.

Example 11

A λ/4 plate was prepared using the optical film of Example 2, and the antireflection performance of the organic EL display device was evaluated. The Re of the optical film of Example 2 is 137 nm.

Comparative Example 11

An optical film of Comparative Example 11 of Re=137 nm was prepared by adjusting the film thickness under the conditions of Comparative Example 1, and thus a λ/4 plate was prepared to evaluate the antireflection performance of the organic EL display device.

(Mounting on Organic EL Display Device)

GALAXY SII manufactured by SAMSUNG having an organic EL panel mounted therein was decomposed to peel off a circularly polarizing plate, and the optical films of Example 11 and Comparative Example 11 were bonded to the peeled surface. Further, a polarizing plate prepared with reference to JP2001-141926A was bonded to each film to obtain λ/4 plates of Example 11 and Comparative Example 11, and each plate was mounted on an organic EL display device. At this case, the absorption axis of the polarizing plate was made to have a relationship of 45° with the slow axis of each of the films of Example 11 and Comparative Example 11. For the bonding, an optically isotropic adhesive (SK2057, manufactured by Soken Chemical & Engineering Co., Ltd.) was used.

(Evaluation of Display Performance)

The visibility under bright light and the display quality of the prepared organic EL display devices were evaluated.

The display devices were allowed to perform black display, and reflected light was observed in a case where fluorescent light and the like were applied at a front surface and a polar angle of 60°. The display qualities at the front surface and the polar angle of 60° were evaluated in accordance with the following standards. The evaluation results are shown in Table 2.

(Evaluation Standards)

A: Tint is not visually recognized at all.

B: The tint difference is visually recognized but is negligible.

C: The tint difference is visually recognized, but the amount of reflected light is small, which is not a problem for use.

D: The tint difference is visually recognized and the amount of reflected light is large, which is thus unacceptable.

TABLE 2

|  |  | Comparative Example 11 | Example 11 |
|---|---|---|---|
| Organic EL display device | Liquid crystal alignment | ULH alignment 5 μm thickness pitch of 0.1 μm | ULH alignment 5 μm thickness pitch of 0.1 μm |
|  | Stretching ratio | 0% | 50% |
|  | Film thickness after stretching (μm) | 5 | 3.3 |
|  | Nz value | 0 | 0.5 |
|  | Display performance | D | A |

As results of the evaluation, the performance of Example 11 was the evaluation standard A, and the performance of Comparative Example 11 was the evaluation standard D. It was confirmed that the antireflection performance (display performance) of Example 11 was greatly improved as compared with Comparative Example 11.

Next, an example in which the optical film is used as a λ/2 plate used for an IPS mode liquid crystal display device will be described.

Example 21

Two optical films of Example 2 were bonded to prepare a λ/2 plate, and the plate was used as an optical film of Example 21. The optical properties of this optical film were Nz=0.5 and Re=274 nm. The oblique contrast ratio CR of the IPS was evaluated.

Comparative Example 21

An optical film of Comparative Example 21 of Nz=0 and Re=274 nm was prepared by adjusting the film thickness in Example 21 and a λ/2 plate was obtained to evaluate the oblique contrast CR of the IPS in the same manner as in Example 21.

<Mounting into IPS Mode Liquid Crystal Display Device and Evaluation of Display Performance>

Polarizing plates were removed from the visible side of the liquid crystal cell of iPad (registered trademark, using a photoalignment film, manufactured by Apple, Inc.), and used as a liquid crystal cell in an IPS mode using the photoalignment film. In addition, the pre-tilt angle of the liquid crystal cell was 0°.

The liquid crystal display devices were respectively prepared by bonding the polarizing plate including the λ/2 plate prepared in each of Example 21 and Comparative Example 21 to the liquid crystal cell instead of the peeled polarizing plate. At this time, when observed from a direction perpendicular to the surface of the substrate of the liquid crystal cell, the bonding was performed in the direction such that the absorption axis of the polarizing plate was orthogonal to the optical axis of the liquid crystal layer in the liquid crystal cell. For the bonding, an adhesive (SK2057, manufactured by Soken Chemical & Engineering Co., Ltd.) was used.

<Oblique Contrast Ratio>

A black display and a white display were performed on the liquid crystal display device and the transmittances at an azimuthal angle of 45 degrees (at 45 degrees with respect to the transmission axis of the polarizing plate) and a polar angle of 60 degrees (an angle from the normal direction) were respectively measured using a measurement machine (EZ-Contrast 160D, manufactured by ELDIM). The oblique contrast ratio CR (transmittance of white display/transmittance of black display) was calculated. The contrast ratio was evaluated based on the following evaluation standards. The evaluation results are shown in Table 3.

(Evaluation Standards)
A: 30≤CR
B: 20≤CR<30
C: 5≤CR<20
D: CR<5

TABLE 3

| | | Comparative Example 21 | Example 21 |
|---|---|---|---|
| Organic EL display device | Liquid crystal alignment | ULH alignment 5 μm thickness pitch of 0.1 μm | ULH alignment 5 μm thickness pitch of 0.1 μm |
| | Stretching ratio | 0% | 50% |
| | Film thickness after stretching (μm) | 5 | 3.3 |
| | Nz value | 0 | 0.5 |
| Oblique contrast ratio | | D | A |

As results of the evaluation, the oblique contrast ratio of Example 21 was the evaluation standard A, and the performance of Comparative Example 21 was the evaluation standard D. It was shown that the oblique contrast ratio CR was greatly improved in Example.

EXPLANATION OF REFERENCES

10: optical film
11: support
12: alignment layer
13: cholesteric liquid crystal layer
30: organic EL display device
31: organic EL panel
32: λ/4 plate (antireflection film)
33: rear surface electrode
34: transparent electrode
35: light emitting layer
36: polarizer
40: IPS mode liquid crystal display device
41, 42: polarizing plate
43: liquid crystal cell
44, 45: glass substrate
46a, 46b: liquid crystal molecule
47: transparent anode
48: transparent cathode

What is claimed is:

1. An optical film comprising a cholesteric liquid crystalline phase being fixed,
wherein a helical axis of the cholesteric liquid crystalline phase is aligned in an in-plane uniaxial direction, and
when a refractive index in a Z-axis direction is nz with a thickness direction of the optical film as a Z-axis, a refractive index in an X-axis direction is nx with one in-plane direction in which the refractive index is maximum and which is perpendicular to the Z-axis as an X-axis, a refractive index in a Y-axis direction is ny with an in-plane direction perpendicular to the X-axis as a Y-axis, and the uniaxial direction is the Y-axis direction, an Nz defined by Equation (1) is 0.2 to 0.75

$$Nz=(nx-nz)/(nx-ny) \qquad (1).$$

2. The optical film according to claim 1:
wherein a reverse wavelength dispersion liquid crystal compound is included as a liquid crystal compound constituting the cholesteric liquid crystalline phase.

3. The optical film according to claim 1, comprising a λ/4 plate.

4. The optical film according to claim 1, comprising a λ/2 plate.

5. The optical film according to claim 1, wherein the helical axis of the cholesteric liquid crystalline phase is aligned in a direction parallel to the surface of the optical film.

6. The optical film according to claim 1, wherein an Nz defined by Equation (1) is more than 0.4 and equal to or less than 0.75 instead of the Nz defined by Equation (1) being 0.2 to 0.75.

7. The optical film according to claim 1, comprising a stretched film stretched in the X-axis direction.

8. The optical film according to claim 7:
wherein a reverse wavelength dispersion liquid crystal compound is included as a liquid crystal compound constituting the cholesteric liquid crystalline phase.

9. The optical film according to claim 8, comprising a λ/4 plate.

10. The optical film according to claim 9, comprising a λ/2 plate.

* * * * *